(12) United States Patent
Ciccarelli et al.

(10) Patent No.: US 7,683,674 B2
(45) Date of Patent: Mar. 23, 2010

(54) T-SWITCH BUFFER, IN PARTICULAR FOR FPGA ARCHITECTURES

(75) Inventors: Luca Ciccarelli, Rimini (IT); Andrea Lodi, Castel San Pietro (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 11/810,792

(22) Filed: Jun. 6, 2007

(65) Prior Publication Data

US 2007/0279088 A1 Dec. 6, 2007

(30) Foreign Application Priority Data

Jun. 6, 2006 (EP) .................... 06011668

(51) Int. Cl.
*H03K 19/094* (2006.01)
(52) U.S. Cl. .............................. 326/113; 326/98; 326/41
(58) Field of Classification Search ............. 326/37–41, 326/47, 81–83, 86–87, 112–113
See application file for complete search history.

(56) References Cited

U.S. PATENT DOCUMENTS

| | | | | |
|---|---|---|---|---|
| 4,873,459 A * | 10/1989 | El Gamal et al. | ............... | 326/41 |
| 5,600,264 A * | 2/1997 | Duong et al. | .................. | 326/39 |
| 6,278,290 B1 * | 8/2001 | Young | ........................... | 326/41 |
| 6,674,304 B1 * | 1/2004 | Matthews | ..................... | 326/80 |
| 6,914,449 B2 * | 7/2005 | Kaviani | ........................ | 326/41 |
| 6,949,951 B1 * | 9/2005 | Young et al. | ................... | 326/37 |
| 6,982,570 B1 | 1/2006 | Ang et al. | | |
| 7,084,666 B2 * | 8/2006 | Madurawe | ..................... | 326/38 |
| 7,215,141 B2 * | 5/2007 | Lewis | ........................... | 326/41 |
| 7,417,454 B1 * | 8/2008 | Rahman et al. | ................. | 326/38 |

OTHER PUBLICATIONS

Anderson et al., "Active Leakage Power Optimization for FPGA", Proceedings of the International Symposium on FPGAs, pp. 33-41. ACM, Feb. 2004.
A. Lodi et al., "Compact Buffered Routing Architecture", Lecture Notes in Computer Science, Field-Programmable Logic and Applications, pp. 179-188, Antwerp, Belgium, Sep. 2004.
Bets et al., "Architecture and CAD for Deep-Submicron FPGAs", Kluwer Academic Publishers, 1999.
European Search Report for EP 06 01 1668 dated Oct. 24, 2006.

* cited by examiner

*Primary Examiner*—Vibol Tan
*Assistant Examiner*—Christopher Lo
(74) *Attorney, Agent, or Firm*—Lisa K. Jorgenson; Kevin D. Jablonski; Graybeal Jackson LLP

(57) ABSTRACT

An embodiment of the invention relates to a T-switch for connecting first, second and third lines and comprising an input section in turn including first, second and third input pass transistors, each connecting a respective line with a first internal node of the T-switch, an output section in turn including first, second and third output pass transistors, each connecting a respective line with a second internal node of the T-switch, and a single buffer stage connected to a first and a second voltage reference and inserted between the first and second internal node.

19 Claims, 6 Drawing Sheets

T-SWITCH BUFFER, IN PARTICULAR FOR FPGA ARCHITECTURES

PRIORITY CLAIM

This application claims priority from European patent application No. 06011668.8, filed Jun. 6, 2006, which is incorporated herein by reference.

TECHNICAL FIELD

An embodiment of the present invention relates to a T-switch buffer.

In particular, an embodiment of the present invention relates to a T-switch buffer for re-programmable interconnections of so-called Programmable Gate Arrays architectures (FPGA) and the following description is made with reference to this field of application by way of illustration only.

BACKGROUND

As it is well known, technology scaling is leading to an exponential increase in integrated circuit leakage current, such that below 90 nm static power could be the dominant factor in energy consumption.

In particular, configurable structures such as FPGA (Field-Programmable Gate Arrays) architectures are affected more heavily than other devices such as ASICs by this problem, since they may require many more transistors to support their main feature, the reconfigurability.

Indeed, configurable logic structures have become a valid alternative to ASICs because of the provided software programmability which reduces the design cycle, while density and running frequency greatly increase. It is well known that this flexibility is achieved at the cost of a larger silicon area occupation to accommodate the logic blocks that realize reconfigurability.

However, as technology scales, the area constraint is becoming less restrictive, while the large number of integrated transistors in FPGA architectures is still a source of higher energy consumption of such architectures than the ASIC ones.

Since reconfigurable computing is a promising technology for wireless applications, where systems need to support a variety of changing communication protocols, the power consumption constraint is becoming the main issue that could prevent FPGA architectures from being widely used in this field.

A typical configuration of an FPGA architecture is schematically shown in FIG. 1A and globally indicated with 1. The FPGA architecture 1 comprises a plurality of programmable logic elements 2 arranged in a matrix-like configuration, commonly indicated as gate arrays, each of such programmable logic elements 2 being connected, by means of a plurality of local connections 3, to an interconnection network 4, in turn comprising a plurality of horizontal interconnection lines 4a and vertical interconnection lines 4b.

As shown in the figure, each programmable logic element 2 of the gate array comprises one or more computational blocks 5 such as look-up tables, ALUs, etc. having a plurality of inputs and being connected to an output through a multiplexer 6 having in turn an input connected to a memory element 7.

In particular, the interconnection network 4 allows reconfiguring the FPGA architecture 1, changing the operation thereof.

FIG. 1B schematically shows a FPGA architecture 1, depicted in island-style, and comprising a switch matrix 9 of switch blocks for connecting a plurality of connection lines.

In particular, the figure shows how the programmable logic element 2 is connected to a horizontal connection block 8a and to a vertical connection block 8b in turn connected to the switch matrix 9, in turn comprising a plurality of switches 10.

When power consumption of a FPGA architecture is considered, it is immediately evident that a large part of the device area is often left completely unused when a specific circuit is mapped, and its power consumption is useless.

Several studies have been conducted on dynamic power reduction for FPGA architectures, i.e., provides no benefit.

Recent studies mainly focus on proposing solutions for the routing architecture since this is usually responsible for 60% to 80% of the power consumption, area, and delay of reconfigurable devices such as of the FPGA architectures.

Other works have addressed the problem of reducing active leakage power consumption which is a challenging task since standard techniques configuring a part of logic in sleep mode often cannot apply. This problem of reducing active leakage consumption, evaluating different Hw/Sw techniques, has been described by Anderson et al in the article entitled: "Active leakage Power Optimization for FPGA", Proceedings of the International Symposium on FPGAS, pages 33-41. ACM, February 2004, which is incorporated by reference.

As a matter of fact, the fraction of power consumption due to leakage current in FPGA architectures is rapidly increasing as technology advances. This is mainly due to the threshold voltage scaling which leads to an exponential increase in the subthreshold leakage.

Since leakage generates static power consumption which depends on the number of integrated transistors, FPGA architectures will be suffering from this problem even more than other devices.

It can be verified that the switch block contribution is dominant, since it contains larger buffers and leakage current is proportional to transistor width. Therefore, in order to reduce the overall leakage power consumption, a new circuit for switch block design may be required.

In particular, such new switch block design could be focused on the so called T-switch, i.e. blocks connecting three lines or wires, as described for instance by A. Lodi et al. in the article entitled: "Compact Buffered Routing Architecture", Lecture Notes in Computer Science, Field-Programmable Logic and Applications, pp. 179-188, Antwerp, Belgium, September 2004, which is incorporated by reference.

A standard implementation of such a T-switch is shown in FIG. 2A, globally indicated by 25 and comprises three T-switch buffers, as shown in FIG. 2B, globally indicated by 20.

The switch buffer 20 realizes the connection between a first line L0, a second line L1 or a third line L2. In particular, in FIG. 2B a T-switch buffer 20 having the lines L1 and L2 as input lines and the line L0 as output line. The T-switch 25 of FIG. 2A comprises two further T-switch buffers according to the following connection scheme:

input: L0 and L1; output L2; and
input: L0 and L2; output L1.

In other words, the T-switch 25 comprises three T-switch buffers 20, as the one shown in FIG. 2B.

To do this, the switch buffer 20 comprises:

a first pass-transistor N0 connected between the first line L0 and a first internal node net0;

a second pass-transistor N1 connected between the second line L1 and a second internal node net1; and a third pass-transistor N2 connected between the third line L2 and the second internal node net1.

In the example shown in the FIG. 2B, the pass-transistors N0-N2 are of the NMOS type.

The switch buffer 20 also includes a first inverter 21 and a second inverter 22, inserted between a first and a second voltage reference, in particular a supply voltage reference VDD and ground GND.

In particular, the first inverter 21 comprises a PMOS transistor P3 and an NMOS transistor N3 connected, in series to each other, between the supply voltage reference VDD and ground GND and having their gate terminals connected to each other and to a third internal node net2 and the common drain terminals connected to the first internal node net0.

In a same manner, the second inverter 22 has a PMOS transistor P4 and an NMOS transistor N4 connected, in series to each other, between the supply voltage reference VDD and ground GND and having their gate terminals connected to each other and to the second internal node net1 and the common drain terminals connected to the third internal node net2.

Finally, the switch buffer 20 includes a first P1 and a second pull up transistor P2 inserted between the supply voltage reference VDD and the second internal node net1, the second pull up transistor P2 having its gate terminal connected to the third internal node net2.

In particular, the pull up transistors P1 and P2 are high-voltage or Vth transistors (as indicated by a thicker gate line in the figure) of the PMOS type, all other transistors being standard transistors.

In particular, the T-switch buffer 20 has been designed using standard threshold transistors in its signal path in order to minimize the signal delay propagation, high threshold transistors (P1, P2) having been used for non-critical paths only.

In the case of a PiCoGA routing architecture, as shown in FIG. 2A, three T-switch buffer 20 are needed to implement a complete switch 25 with full connectivity.

Advantageously, the switch 25 realized by using such T-switch buffers 20 has a high speed. However, it shows a significant standby leakage current and thus a quite high static power consumption, which prevent its use in some applications, in particular when applied to programmable routing interconnections of FPGA architectures. In particular, its leakage currents are quite large when the switch 25 is off, i.e. in the idle state.

SUMMARY

An embodiment of the present invention is a T-switch buffer having structural and functional characteristics which allow a reduction in standby and active leakage currents, in this way overcoming a limit which may still affect the switch blocks realized according to the prior art.

An embodiment of the present invention is a T-switch comprising additional pass transistors in order to allow a change of the switch configuration and a single buffer stage.

BRIEF DESCRIPTION OF THE DRAWINGS

Characteristics and advantages of the T-switch according to one or more embodiments of the invention will be apparent from the following description of embodiment(s) thereof given by way of indicative and non limiting example with reference to the annexed drawings.

DETAILED DESCRIPTION

Figure 3:
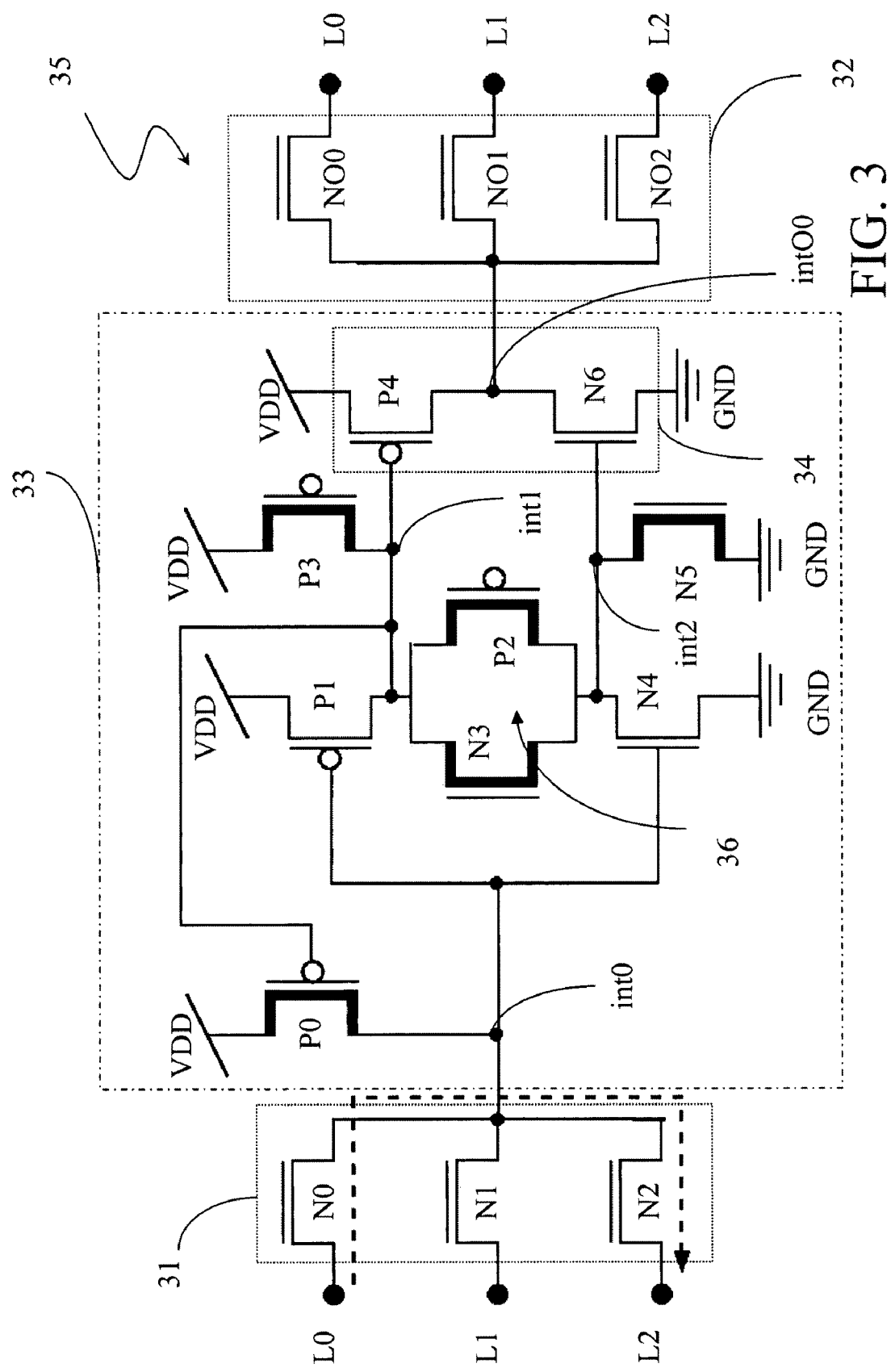
FIG. 3 schematically shows a T-switch for FPGA architectures realized according to an embodiment of the present invention.
Figure 4A:
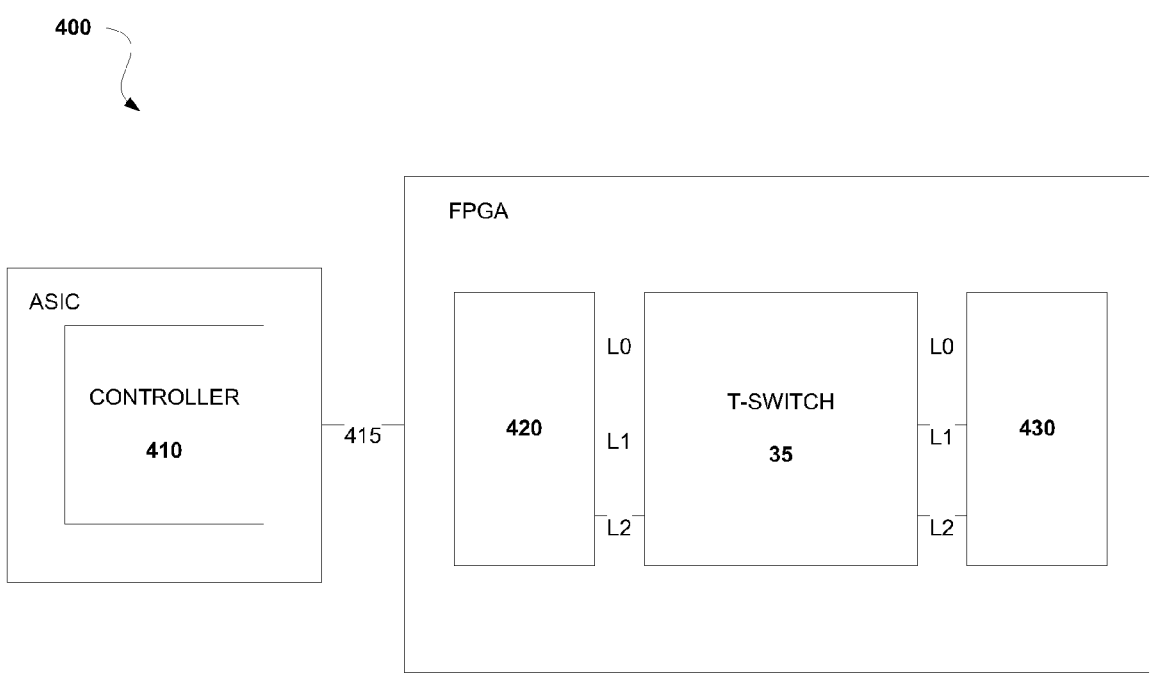
Figure 4B:
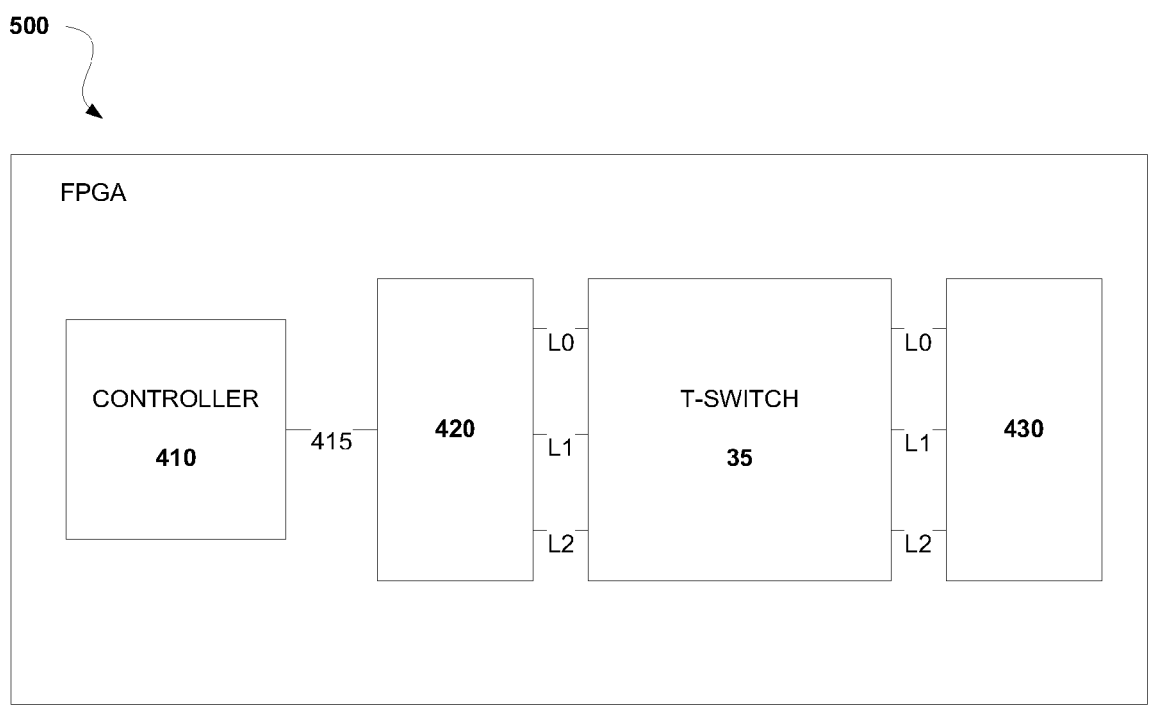

With reference to such figures, and in particular to FIG. 3, a T-switch realized according to an embodiment of the invention is schematically shown and globally indicated as 35.

As already described, the T-switch 35 realizes the connection between a first line L0, a second line L1 and a third line L2 and includes an input section 31 connected to the lines L0-L1 and to a first internal node int0; in particular, the input section 31 of the T-switch 35 comprises:

a first pass-transistor N0 connected between the first line L0 and the first internal node int0;

a second pass-transistor N1 connected between the second line L1 and the first internal node int0; and a third pass-transistor N2 connected between the third line L2 and the first internal node int0.

In a similar manner, the T-switch 35 comprises an output section 32 connected to the lines L0-L1 and to a second internal node intO0 and comprising:

a third pass-transistor NO0 connected between the first line L0 and the second internal node intO0;

a second pass-transistor N01 connected between the second line L1 and the second internal node intO0; and a third pass-transistor NO2 connected between the third line L2 and the second internal node intO0.

According to an embodiment of the invention, the T-switch 35 comprises a buffer stage 33 connected to a first and a second voltage reference, in particular a supply voltage reference VDD and ground GND and inserted between the first int0 and second internal node intO0.

Figure 1A:
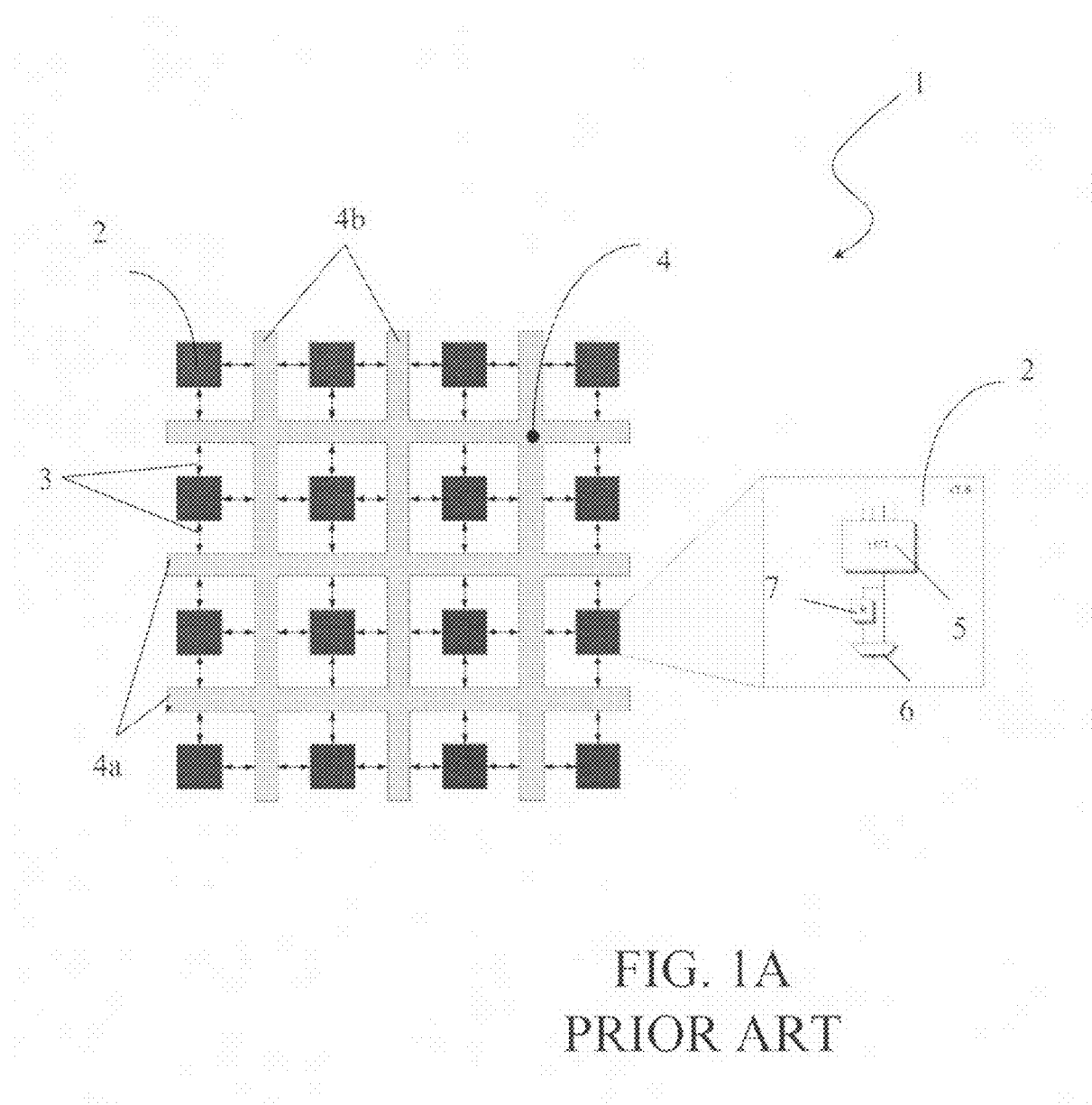
FIG. 1A schematically shows a FPGA architecture realized according to a known design.
Figure 1B:
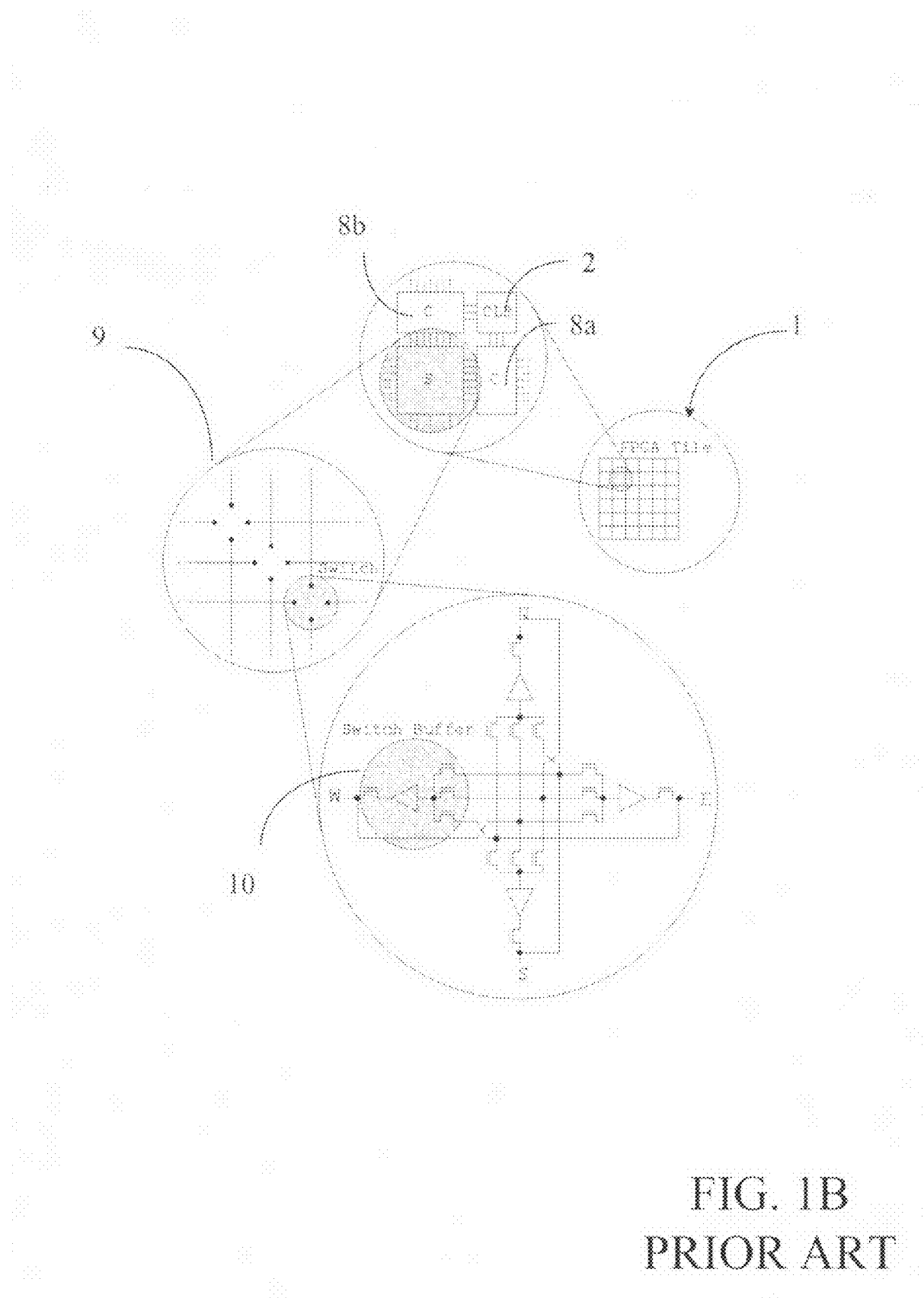
FIG. 1B schematically shows in an island style a FPGA architecture realized according to a known design.
Figures 2A, 2B:
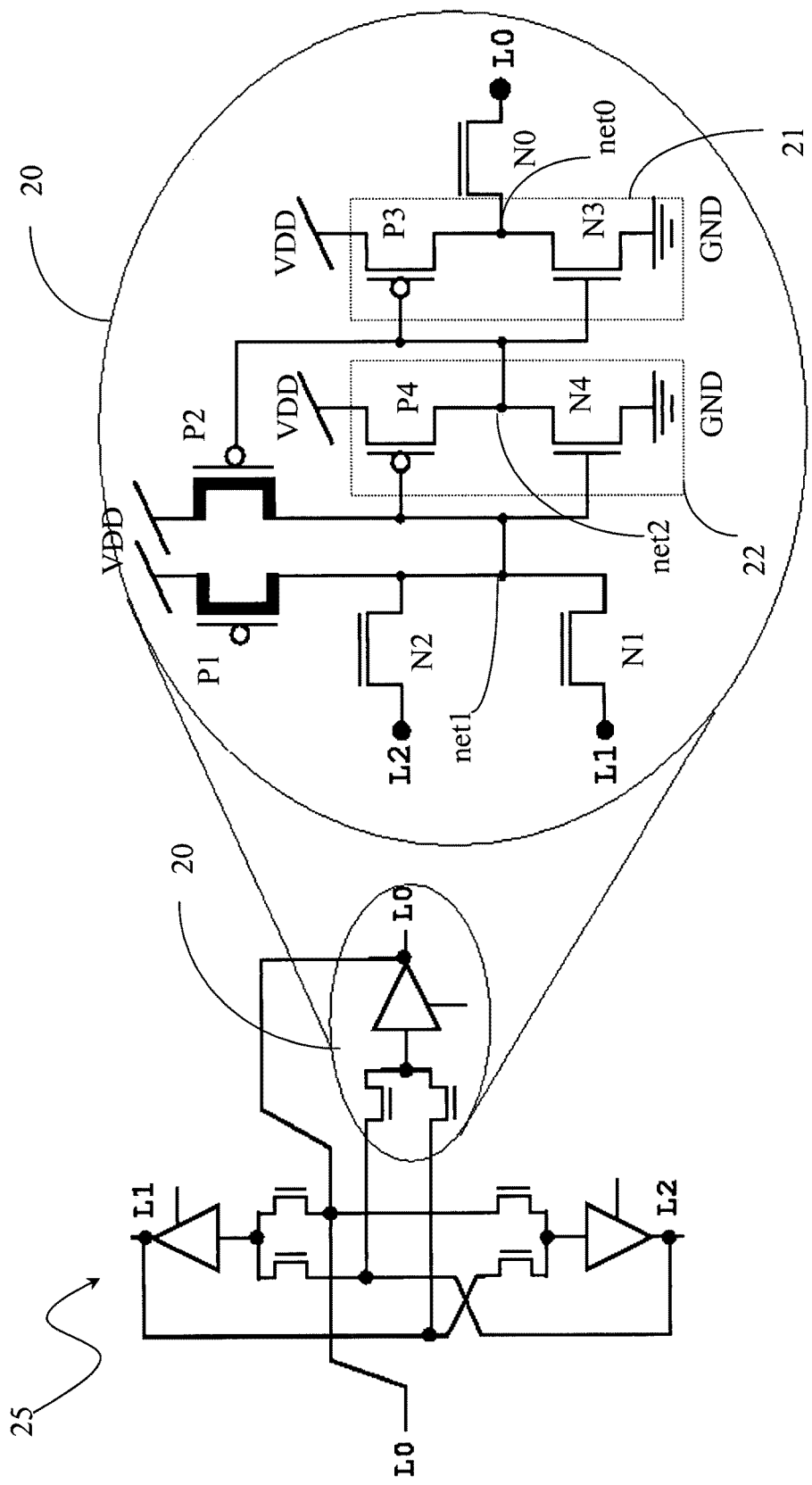
FIGS. 2A and 2B schematically show a switch configuration and a T-switch buffer for FPGA architectures, respectively, realized according to the prior art.

When comparing the design of the T-switch 35 with the prior art solutions, in particular the switch 25 shown in FIG. 2A, it is thus noted that one additional input pass transistor (N0) and two additional output pass transistors (NO1 and NO2) have been added while only one buffer stage 33 is used instead of the three buffers comprised in the above indicate known solution.

As will be clear in the following description, according to an embodiment of the invention, the added pass transistors are configured to implement all the possible switching configurations among the lines L0-L2.

Moreover, the use of only one buffer stage 33 reduces both area occupation and leakage power.

Further according to an embodiment of the invention, the buffer stage 33 has been designed to reduce the leakage current through its components.

In particular, as shown in FIG. 3, the buffer stage 33 comprises:

a first pull up transistor P0 inserted between the supply voltage reference VDD and the first internal node int0 and having a gate terminal connected to a third internal node int1;

a first internal transistor P1 inserted between the supply voltage reference VDD and the third internal node int1 and having a gate terminal connected to the first internal node int0; and a second internal transistor N4 inserted between a fourth internal node int2 and ground GND.

Moreover, the buffer stage 33 further comprises a third N3 and fourth internal transistor P2, inserted, in parallel to each other, between the third internal node int1 and the fourth internal node int2.

In the embodiment shown in FIG. 3, the first pull up transistor P0 is a High Voltage or HV MOS transistor of the P type, the first internal transistor P1 is a standard MOS transistor of the P type, the second internal transistor N4 is a standard MOS transistor of the N type, the third internal transistor N3 is High Voltage or HV MOS transistor of the N type, and the fourth internal transistor P2 is a High Voltage or HV MOS transistor of the P type. In particular, it should be noted that the third and fourth internal transistors, N3 and P2, form a high threshold CMOS stage 36.

The buffer stage 33 according to an embodiment of the invention further comprises:

a second pull up transistor P3 inserted between the supply voltage reference VDD and the third internal node int1; and a pull down transistor N5 inserted between the fourth internal node int2 and ground GND.

In the embodiment shown in FIG. 3, the second pull up transistor P3 and the pull down transistor N5 are High Voltage or HV MOS transistors of the P and N type, respectively.

Finally, the buffer stage 33 comprises an inverter 34, inserted between the supply voltage reference VDD and ground GND and further comprising a first P4 and a second inverter transistor N6, in series to each other and having common drain terminals connected to the second internal node intO0.

More particularly, the first inverter transistor P4 has a gate terminal connected to the third internal node int1 and the second inverter transistor N6 has a gate terminal connected to the fourth internal node int2.

In the embodiment shown in FIG. 3, the first P5 and second inverter transistor N6 are standard MOS transistors of the P and N type, respectively.

The operation of the T-switch 35 according to an embodiment of the invention will be now briefly discussed.

In an idle state, i.e. when the switch is off, the second pull up transistor P3 and the pull down transistor N5 are turned on, while the other transistors are turned off (in particular, the first internal transistor P1 and the second internal transistor N4 have a drain-source voltage value Vds=0), keeping the second internal node intO0 in a high impedance condition.

In this condition, the second internal node intO0 assumes an intermediate voltage value between the supply voltage reference VDD and ground GND which is determined by the leakage current through the inverter transistors P4 and N6, and the output pass transistors N7, N8 and N9. In other words, such intermediate voltage value is determined by the voltage signals of the lines L0-L2.

Considering that the subthreshold current of a MOS transistor depends exponentially on its drain-source voltage value Vds, the intermediate voltage value of the second internal node intO0 greatly reduces the leakage consumption through the inverter transistors P4 and N6 and the output pass transistors N7, N8 and N9. In this way the T-switch 35 according to an embodiment of the invention implements the so called self reverse biasing technique.

It should be remarked that the leakage consumption through the above indicated transistors is the main contribution to the total leakage power dissipation of the T-switch 35, since the output stage 32 of the T-switch 35 has the widest transistors.

Similarly, the first internal node int0 is in the high impedance condition, thus reducing the leakage power of the input pass transistors N0, N1 and N2 as well.

Moreover, in a standby mode, the current path between the third internal node int1 (fixed to the supply voltage reference VDD) and fourth internal node int2 (fixed to ground GND) passes only through High Voltage transistors, more particularly the third internal transistor N3 and the fourth internal transistor P2, minimizing the leakage power dissipation of the input section 31 of the T-switch 35. In this way the T-switch 35 according to an embodiment of the invention implements the so called dual-threshold technique.

It should be however remarked that, from a timing performance point of view, the T-switch 35 according to an embodiment of the invention increases the signal delay compared to the switch 25 described with reference to prior art and shown in FIGS. 2A and 2B. This delay increase is mainly due to the introduction—in the signal path of the buffer stage 33—of the high threshold CMOS stage 36 comprising the internal transistors N3 and P3.

Moreover, since the T-switch 35 has a single buffer stage 33, its propagation delay is also affected by the fan-out, which can be one or two in the PiCoGA routing architecture.

According to an embodiment of the invention, the possibility to independently drive the input pass transistors N0, N1 and N2 of the T-switch 35 provides support for a software technique which reduces active leakage consumption.

In particular, the T-switch 35 may be exploited to propagate a signal between two lines by turning on a corresponding pass transistors in the input stage 31.

In FIG. 3, an unbuffered path connecting the first line L0 to the third line L2 is shown with a dashed line which passes through a series of two nMOS transistors, i.e. the first and third input pass transistors N0 and N2.

When the T-switch 35 is configured to operate in unbuffered mode, the corresponding buffer stage 33 can be completely switched off, turning off the output pass transistors NO0, NO1 and NO2 and the buffer stage 33.

As a result, the buffering part of the T-switch 35 has a same leakage current as obtained in the standby condition, even though the T-switch 35 is effectively used. In this case, the active leakage can be reduced by one order of magnitude.

The possibility of exploiting the T-switch 35 in the unbuffered mode is strictly related to the performance degradation deriving from the propagation of signals through a series of pass transistors instead of buffers.

In order to evaluate such a delay increase, an analysis has been carried out on a set of MCNC benchmark using VPR as described by Bets et al. in "Architecture and CAD for Deep-Submicron FPGAs", Kluwer Academic Publishers, 1999, which is incorporated by reference.

A routing architecture with only unbuffered switches (modeled by cMOS pass-transistors) achieves the minimum active leakage power, since the buffering stage is completely avoided. However in this configuration the average critical path shows increases of about 20% on 80% of the studied benchmark and of 64% on the largest algorithms.

Since the routing architecture according to the T-switch 35 is based on nMOS pass transistors instead of cMOS ones, the degradation of a signal crossing a series of more than four switches may make this solution unacceptable both in terms of signal delay and of dynamic power dissipation.

Therefore, when using a T-switch 35 according to an embodiment of the invention, the substitution of buffered switches with unbuffered ones may be made only in the case the critical path is not increased.

In this regard, it should be noted that, in order to avoid excessive signal degradation, only series of at most two pass transistors should be allowed.

It should be remarked that, according to an embodiment of the invention, the input stage 31 of the T-switch 35 is used as an output stage in case of an unbuffered switch.

In order to avoid such a delay increase, an embodiment of the present invention relates to a configuration method that, starting from a routed circuit, considers the substitution of buffered switches with unbuffered ones only in the case the critical path is not modified.

According to an embodiment of the invention, the configuration method has been also developed to substitute the buffered switches with unbuffered ones in a circuit mapped on a FPGA architecture. The method comprises the following steps:

1) Timing analysis of the graph of nodes representing routing and logic resources of the FPGA architecture used by the mapped circuit. The slack obtained for each net represents the delay which can be added without modifying the critical path.
2) Substitution of a buffered switch with an unbuffered one starting from the input nodes of the analyzed circuit.
3) Verification that the critical path delay has not been modified through timing analysis.
4) If the substitution is done, all slacks are recalculated, returning to step 2.

The substitution of a buffered switch with an unbuffered one increases the delay of the related path. However, if the net is multi-fanout, its load capacitance may also increase, introducing an additional delay. Therefore step 3 may be necessary to correctly take in consideration this case.

As result, the proposed configuration method could substitute about 39% of buffered switches with unbuffered ones in one example, obtaining a corresponding reduction of active leakage power dissipation without performance degradation.

In order to avoid excessive signal degradation, a maximum number (in particular two) of pass transistors is allowed in the unbuffered mode, i.e. when the switch is active but no buffer stage is used.

As a result of the carried out analysis, it can be verified that in one example the above indicated algorithm could replace about 39% of buffered switches with unbuffered ones, obtaining a reduction of active leakage power dissipation without performance degradation.

A performance analysis of the T-switch 35 according to an embodiment of the invention has been performed, taking into account timing performance, area occupation, and leakage power consumption, which is a key issue, in particular with respect to the known solution shown in FIGS. 2A and 2B.

In both T-switches, the final inverter 32 and 21, respectively, has been designed with a same driving capability and then it has been tuned for each buffer in order to minimize signal propagation delay and to balance both the rise and fall paths.

The new T-switch 35 and known T-switch 25 have been analyzed comparing both an average standby and an active leakage power dissipation. In particular, the average values have been calculated considering each possible combination of signal at the lines (L0-L2), and, in the case of the active leakage, for two possible fan-out configurations of the switch.

The combination of the hardware techniques described (dual-threshold and self reverse biasing) used by the T-switch 35 reduces the average standby leakage power of 89% and the active leakage power of 47% with respect to the known T-switch 25.

It can be seen that the T-switch 35 used in unbuffered mode reduces the active subthreshold current of almost one order of magnitude with respect to the buffered mode.

However, since only 39% of the total switches can be changed from buffered to unbuffered mode without performance degradation in one example, a global reduction of the average active leakage power of 63% may be obtained in one example.

The analysis of the active leakage power has been carried out for each possible configurations of the switches, considering the signal values at the lines L0-L2. If we assume that a switch block consumes 58% of the leakage power of an entire tile, a 52% standby and 37% active leakage power reduction for an FPGA device can be achieved.

The T-switch 35 occupies 45% less area than the known T-switch 25, which leads to a 18% area reduction for the entire FPGA tile.

Moreover the T-switch 35 needs seven memory cells instead of nine to implement a full connectivity for the switch architecture analyzed.

It can be also verified that the T-switch 35 according to an embodiment of the invention has a signal propagation delay which is from 10% (fan out=1) to 25% (fan out=2) more than the one of the known solutions.

In summary, a T-switch 35 has been designed having a low leakage and also reducing area occupation of a standard implementation.

More particularly, by combining hardware and software techniques, both active and standby leakage power in FPGAs may be reduced.

In particular the use of the described software approach, which is related to the proposed switch architecture which provides for a single driving of the pass transistors, is useful to minimize active subthreshold current.

At the same time the hardware design of the switch buffer allows minimizing both the standby leakage current and the active one using a combination of dual threshold and self reverse biasing techniques.

Furthermore, advantageously according to an embodiment of the invention the area occupation of the proposed switch architecture has been reduced by about 50%.

Finally, a reduction of the number of switch configuration SRAMs has been also provided, requiring only a limited signal delay increasing (of about 10%).

The T-switch 35 of FIG. 3 may be incorporated in a first integrated circuit (IC) such as an FPGA, which may be incorporated into a system in which the first IC is coupled to a second IC such as a controller.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A T-switch for connecting first, second and third lines and comprising:
   an input section in turn including first, second, and third input pass transistors, each connecting a respective line with a first internal node;
   an output section in turn including first, second and third output pass transistors, each connecting a respective line with a second internal node; and
   a single buffer stage connected to a first and a second voltage reference and inserted between said first and second internal nodes, said buffer stage including a first pull up transistor inserted between said first voltage reference and said first internal node and having a gate terminal connected to a third internal node of said buffer stage, a first internal transistor inserted between said first voltage reference and said third internal node and having a gate terminal connected to said first internal node, a second internal transistor inserted between a fourth internal node of said buffer stage and said second voltage reference, and a high threshold stage inserted between said third internal node and a fourth internal node of said buffer stage.

2. The T-Switch of claim 1, wherein said high threshold stage in turn comprises internal transistors inserted, in parallel to each other, between said third internal node and said fourth internal node.

3. The T-Switch of claim 1, wherein said buffer stage further comprises:

a second pull up transistor inserted between said first voltage reference and said third internal node; and a pull down transistor inserted between said fourth internal node and said second voltage reference.

4. The T-Switch of claim 2, wherein said internal transistors of said high threshold stage are High Voltage MOS transistors of the N and P type, respectively.

5. The T-Switch of claim 3, wherein said second pull up transistor and said pull down transistor are High Voltage MOS transistors of the P and N type, respectively.

6. The T-Switch of claim 3, wherein said buffer stage further comprises an inverter, inserted between said first and second voltage references and further comprising a first and a second inverter transistor, in series to each other and having common drain terminals connected to said second internal node and respective gate terminals connected to said third internal node and said fourth internal node.

7. The T-Switch of claim 6, wherein said first and second inverter transistors are standard MOS transistors of the P and N type, respectively.

8. A pass gate, comprising:
first and second input nodes;
first and second output nodes;
a single buffer having
a buffer input node,
a buffer output node,
a first transistor of a first type coupled between first and second reference nodes and having a first conduction node connected to a first internal node, a second conduction node connected to a second internal node, and
a second transistor of a second type coupled between said first and second reference nodes and having a first conduction node connected to the first internal node, a second conduction node connected to the second internal node;
a third transistor of the first type having a control node coupled to the buffer input node, a first conduction node coupled to the first reference node, and a second conduction node coupled to the first internal node;
a fourth transistor of the second type having a control node coupled to the buffer input node, a first conduction node coupled to the second internal node, and a second conduction node coupled to the second reference node;
first and second input transistors respectively coupled between the first and second input nodes and the buffer input node; and first and second output transistors respectively coupled between the buffer output node and the first and second output nodes.

9. The pass gate of claim 8 wherein:
the first transistor has a first threshold magnitude;
the second transistor has a second threshold magnitude;
the third transistor has a third threshold magnitude that is less than the first threshold magnitude; and
the fourth transistor has a fourth threshold magnitude that is less than the second threshold magnitude.

10. A pass gate, comprising:
first and second input nodes;
first and second output nodes;
a single buffer having a buffer input node and a buffer output node;
first and second input transistors respectively coupled between the first and second input nodes and the buffer input node; and
first and second output transistors respectively coupled between the buffer output node and the first and second output nodes, wherein the buffer comprises
a first reference node,
a second reference node,
a first transistor of a first type having a control node coupled to the buffer input node, a first conduction node coupled to the first reference node, and a second conduction node,
a second transistor of the first type having a first conduction node coupled to the second conduction node of the first transistor and having a second conduction node,
a third transistor of a second type having a first conduction node coupled to the second conduction node of the first transistor and having a second conduction node coupled to the second conduction node of the second transistor,
a fourth transistor of the second type having a control node coupled to the buffer input node, a first conduction node coupled to the second conduction node of the third transistor, and a second conduction node coupled to the second reference node, and
a fifth transistor of the first type having a control node coupled to the second conduction node of the first transistor, a first conduction node coupled to the first reference node, and a second conduction node coupled to the buffer input node.

11. A pass gate, comprising:
first and second input nodes;
first and second output nodes;
a single buffer having a buffer input node and a buffer output node;
first and second input transistors respectively coupled between the first and second input nodes and the buffer input node; and
first and second output transistors respectively coupled between the buffer output node and the first and second output nodes, wherein the buffer comprises:
a first reference node,
a second reference node,
a first transistor of a first type having a control node coupled to the buffer input node, a first conduction node coupled to the first reference node, a second conduction node, and a first threshold magnitude,
a second transistor of the first type having a first conduction node coupled to the second conduction node of the first transistor, a second conduction node, and a second threshold magnitude that is greater than the first threshold magnitude, a third transistor of a second type having a first conduction node coupled to the second conduction node of the first transistor, a second conduction node coupled to the second conduction node of the second transistor, and a third threshold magnitude, a fourth transistor of the second type having a control node coupled to the buffer input node, a first conduction node coupled to the second conduction node of the third transistor, a second conduction node coupled to the second reference node, and a fourth threshold magnitude that less than the third threshold magnitude, and a fifth transistor of the first type having a control node coupled to the second conduction node of the first transistor, a first conduction node coupled to the first reference node, a second conduction node coupled to the buffer input node, and a fifth threshold magnitude that is greater than the first threshold magnitude.

12. The pass gate of claim 8 wherein the buffer further comprises:

a fifth transistor of a second type having a control node coupled to the second internal node, a first conduction node coupled to the buffer output node, and a second conduction node coupled to the second reference node; and a sixth transistor of the second type having a first conduction node coupled to the second internal node and having a second conduction node coupled to the second reference node.

13. The pass gate of claim 12 wherein:
the third transistor has a first threshold magnitude;
the fourth transistor has a second threshold magnitude that is less than the first threshold;
the fifth transistor has a third threshold magnitude; and
the sixth transistor has a fourth threshold magnitude that is greater than the third threshold magnitude.

14. The pass gate of claim 8, further comprising:
a third input node;
a third output node;
a third input transistor coupled between the third input node and the buffer input node; and
a third output transistor coupled between the buffer output node and the third output node.

15. An integrated circuit, comprising:
a first circuit;
a second circuit; and
a programmable pass gate operable to couple the first circuit to the second circuit, the pass gate comprising,
 first and second input nodes,
 first and second output nodes,
 a single buffer having
  a buffer input node,
  a buffer output node,
  a first transistor of a first type coupled between first and second reference nodes and having a first conduction node connected to a first internal node, a second conduction node connected to a second internal node, and
  a second transistor of a second type coupled between first and second reference nodes and having a first conduction node connected to the first internal node, a second conduction node connected to the second internal node,
  a third transistor of the first type having a control node coupled to the buffer input node, a first conduction node coupled to the first reference node, and a second conduction node coupled to the first internal node;
  a fourth transistor of the second type having a control node coupled to the buffer input node, a first conduction node coupled to the second internal node, and a second conduction node coupled to the second reference node;
 first and second input transistors respectively coupled between the first and second input nodes and the buffer input node, and
 first and second output transistors respectively coupled between the buffer output node and the first and second output nodes.

16. A system, comprising:
a first circuit;
a second circuit;
a programmable pass gate operable to couple the first circuit to the second circuit, the pass gate comprising,
 first and second input nodes,
 first and second output nodes,
 a single buffer having
  a buffer input node,
  a buffer output node,
  a first transistor of a first type coupled between first and second reference nodes and having a first conduction node connected to a first internal node, a second conduction node connected to a second internal node;
  a second transistor of a second type coupled between said first and second reference nodes and having a first conduction node connected to the first internal node, a second conduction node connected to the second internal nodes;
  a third transistor of the first type having a control node coupled to the buffer input node, a first conduction node coupled to the first reference node, and a second conduction node coupled to the first internal node;
  a fourth transistor of the second type having a control node coupled to the buffer input node, a first conduction node coupled to the second internal node, and a second conduction node coupled to the second reference node;
 first and second input transistors respectively coupled between the first and second input nodes and the buffer input node, and
 first and second output transistors respectively coupled between the buffer output node and the first and second output nodes; and
a controller coupled to the first circuit.

17. The system of claim 16 wherein the first circuit, second circuit, pass gate, and controller are disposed on a same die.

18. The system of claim 16 wherein:
the first circuit, second circuit, and pass gate are disposed on a first die; and
the controller is disposed on a second die.

19. The system of claim 16 wherein the first circuit, second circuit, and pass gate are disposed on an FPGA.

* * * * *